(12) United States Patent
Komitsu (10) Patent No.: US 9,716,216 B2
(45) Date of Patent: Jul. 25, 2017

(54) THERMOELECTRIC POWER GENERATING DEVICE

(75) Inventor: Hideyuki Komitsu, Toyota (JP)

(73) Assignee: TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 47 days.

(21) Appl. No.: 14/373,830

(22) PCT Filed: Jan. 31, 2012

(86) PCT No.: PCT/JP2012/000586
§ 371 (c)(1),
(2), (4) Date: Jul. 22, 2014

(87) PCT Pub. No.: WO2013/114428
PCT Pub. Date: Aug. 8, 2013

(65) Prior Publication Data
US 2015/0068575 A1    Mar. 12, 2015

(51) Int. Cl.
*H01L 35/30* (2006.01)
*F02G 5/04* (2006.01)
(Continued)

(52) U.S. Cl.
CPC ............ *H01L 35/30* (2013.01); *F01N 5/025* (2013.01); *F02G 5/02* (2013.01); *F02G 5/04* (2013.01);
(Continued)

(58) Field of Classification Search
CPC ......... H01L 35/02; H01L 35/28; H01L 35/30; H01L 35/32; H01L 35/34; Y02T 10/166;
(Continued)

(56) References Cited

U.S. PATENT DOCUMENTS

2005/0204762 A1    9/2005  Sasaki et al.
2009/0139556 A1*   6/2009  Bell ................... F01P 9/06
                                               136/201
(Continued)

FOREIGN PATENT DOCUMENTS

DE    WO 2010130764 A2 * 11/2010 ............. F01N 5/025
JP    2000-018095 A      1/2000
(Continued)

*Primary Examiner* — Devina Pillay
*Assistant Examiner* — Daniel Malley, Jr.
(74) *Attorney, Agent, or Firm* — Sughrue Mion, PLLC (57) ABSTRACT

[Object] Provided is a thermoelectric power generating device that is able to decrease thermal distortion of thermoelectric conversion modules and to upsize the thermoelectric conversion modules, thereby making it possible to simplify a manufacturing operation and to decrease a manufacturing cost. A thermoelectric power generating device (17) is configured to include: a body case (20) accommodating therein thermoelectric conversion modules (27); an exhaust-pipe portion (19) provided in the body case (20) so as to be opposed to heat-receiving substrates (31) of the thermoelectric conversion modules (27); a steam tank (37) attached to an outer side of the body case (20) so as to be opposed to heat-dissipation substrates (32) of the thermoelectric conversion modules (27); a steam tank (40) provided above the body case (20); thermoelectric conversion modules (41) provided above the steam tank (40) so that heat-dissipation substrates (43) thereof are opposed to the steam tank (40); and a cooling water tank (51) provided above the thermoelectric conversion modules (41) so as to be opposed to heat-receiving substrates (42) of the thermoelectric conversion modules (41).

5 Claims, 5 Drawing Sheets (51) Int. Cl.
*F01N 5/02* (2006.01)
*F02G 5/02* (2006.01)
*H01L 35/32* (2006.01)

(52) U.S. Cl.
CPC .......... *H01L 35/32* (2013.01); *F01P 2060/08* (2013.01); *F01P 2060/16* (2013.01); *Y02T 10/16* (2013.01); *Y02T 10/166* (2013.01)

(58) Field of Classification Search
CPC ........ F01N 5/025; F01N 2240/02; F02G 5/04; F22B 1/006; F22B 1/02; F28D 15/0266
See application file for complete search history.

(56) References Cited

U.S. PATENT DOCUMENTS

2012/0060775 A1* 3/2012 Aixala .................... F01N 5/025
123/2
2013/0019598 A1 1/2013 Tamaura et al.

FOREIGN PATENT DOCUMENTS

| | | |
|---|---|---|
| JP | 2002-272152 A | 9/2002 |
| JP | 2005-264869 A | 9/2002 |
| JP | 2004-343898 A | 12/2004 |
| WO | 2011/121852 A1 | 10/2011 |

* cited by examiner

THERMOELECTRIC POWER GENERATING DEVICE

TECHNICAL FIELD

The present invention relates to a thermoelectric power generating device, and particularly, relates to a thermoelectric power generating device performing a thermoelectric power generation by use of exhaust gas discharged from an internal combustion engine.

BACKGROUND ART

Conventionally, a thermal energy is included in exhaust gas or the like discharged from an internal combustion engine of a vehicle such as an automobile, and if the exhaust gas is just discarded, the thermal energy is wasted. In view of this, the thermal energy included in the exhaust gas is collected by a thermoelectric power generating device, so as to be converted into an electrical energy and charged into a battery, for example.

As such a conventional thermoelectric power generating device, there has been known a thermoelectric power generating device in which a high-temperature part of a thermoelectric conversion module makes contact with an exhaust pipe into which exhaust gas discharged from an internal combustion engine is introduced, and a low-temperature part of the thermoelectric conversion module makes contact with a cooling water pipe through which cooling water circulates (see, for example, Patent Document 1).

The thermoelectric conversion module is configured to include a thermoelectric transducer such as a semiconductor, electrodes, a heat-receiving substrate serving as the high-temperature part, a heat-dissipation substrate serving as the low-temperature part, and the like. The thermoelectric conversion module generates electric power by causing a temperature difference between the high-temperature part and the low-temperature part of the thermoelectric conversion module due to exhaust gas having a high temperature and cooling water at a low temperature by use of a Seebeck effect.

CITATION LIST

Patent Documents

Patent Document 1: Japanese Patent Application Publication No. 2000-18095

SUMMARY OF THE INVENTION

Problem to be Solved by the Invention

However, in such a conventional power transmission device, the exhaust gas at a high temperature (e.g., around 500° C.) is introduced into the high-temperature part of the thermoelectric conversion module, and the cooling water at a low temperature (e.g., 40° C.) is introduced into the low-temperature part, so that a temperature difference between the high-temperature part and the low-temperature part of the thermoelectric conversion module becomes large.

Because of this, the high-temperature part of the thermoelectric conversion module expands relative to the low-temperature part, thereby causing large thermal distortion, which may damage the thermoelectric conversion module. In order to prevent the thermoelectric conversion module from being damaged by the thermal distortion, it is necessary to downsize the thermoelectric conversion module. However, if the thermoelectric conversion module is downsized, many thermoelectric conversion modules are required to secure a power generation amount of the thermoelectric conversion module.

This accordingly results in that many electric wirings and the like to connect the many thermoelectric conversion modules are required, which causes trouble over a manufacturing operation of the thermoelectric power generating device and increases a manufacturing cost of the thermoelectric power generating device.

The present invention is accomplished in order to solve the above conventional problem, and an object of the present invention is to provide a thermoelectric power generating device that is able to decrease thermal distortion of thermoelectric conversion modules and to upsize the thermoelectric conversion modules, thereby making it possible to simplify a manufacturing operation and to decrease a manufacturing cost.

Means for Solving the Problem

In order to achieve the above object, a thermoelectric power generating device according to the present invention is a thermoelectric power generating device including thermoelectric conversion modules each performing a thermoelectric power generation according to a temperature difference between a high-temperature part and a low-temperature part, and the thermoelectric power generating device is configured to include: an exhaust-gas introduction portion configured to introduce, into the high-temperature part, exhaust gas discharged from an internal combustion engine; and a steam flow portion configured to introduce, into the low-temperature part, steam of refrigerant heated by heat of the exhaust gas.

The thermoelectric power generating device is configured such that: the exhaust gas discharged from the internal combustion engine is introduced into the high-temperature parts of the thermoelectric conversion modules, and the steam of the refrigerant heated by heat of the exhaust gas is introduced into the low-temperature parts of the thermoelectric conversion modules. This accordingly makes it possible to prevent an excessively large temperature difference between the high-temperature parts and the low-temperature parts and to restrain thermal distortion of the thermoelectric conversion modules.

This accordingly makes it possible to upsize the thermoelectric conversion modules and reduce the number of electric wirings and the like at the time when the thermoelectric conversion modules are attached to the thermoelectric power generating device. This consequently makes it possible to simplify a manufacturing operation of the thermoelectric power generating device and to reduce a manufacturing cost of the thermoelectric power generating device.

Preferably, the thermoelectric power generating device may be configured such that: the thermoelectric conversion modules are constituted by first thermoelectric conversion modules having a high operation temperature range and second thermoelectric conversion modules having an operation temperature range lower than that of the first thermoelectric conversion modules, and the steam flow portion is constituted by a first steam flow portion and a second steam flow portion communicating with the first steam flow portion, and the thermoelectric power generating device may be configured to include: a body case accommodating therein the first thermoelectric conversion modules; the exhaust-gas introduction portion provided in the body case so as to be opposed to the high-temperature parts of the first thermoelectric conversion modules; the first steam flow portion attached to an outer side of the body case so as to be opposed to the low-temperature parts of the first thermoelectric conversion modules; the second steam flow portion provided above the body case; the second thermoelectric conversion modules provided above the second steam flow portion so that the low-temperature parts thereof are opposed to the second steam flow portion; and a cooling water flow portion provided above the second thermoelectric conversion modules so as to be opposed to the high-temperature parts of the second thermoelectric conversion modules.

In the thermoelectric power generating device, the exhaust gas is introduced into the high-temperature parts of the first thermoelectric conversion modules having a high operation temperature range, and the steam is introduced into the low-temperature parts of the first thermoelectric conversion modules. This accordingly makes it possible to prevent an excessively large temperature difference between the high-temperature parts and the low-temperature parts of the first thermoelectric conversion modules and to restrain thermal distortion of the first thermoelectric conversion modules.

Further, the steam is introduced into the high-temperature parts of the second thermoelectric conversion modules having an operation temperature range lower than that of the first thermoelectric conversion modules, and cooling water is introduced into the low-temperature parts of the second thermoelectric conversion modules. This accordingly makes it possible to prevent an excessively large temperature difference between the high-temperature parts and the low-temperature parts of the second thermoelectric conversion modules and to restrain thermal distortion of the second thermoelectric conversion modules.

Further, in a range where a temperature of the exhaust gas is high, a power generation is performed by the first thermoelectric conversion modules and the second thermoelectric conversion modules, and in a range where the temperature of the exhaust gas is low, the power generation is performed by the second thermoelectric conversion modules. Hereby, it is possible to perform the power generation in a large temperature range, that is, in a large operating range of a vehicle.

Further, since the steam at the same temperature is introduced into the low-temperature parts of the first thermoelectric conversion modules and the high-temperature parts of the second thermoelectric conversion modules, it is possible to equalize temperatures of the low-temperature parts of the first thermoelectric conversion modules and the high-temperature parts of the second thermoelectric conversion modules, thereby making it possible to improve generating efficiencies of the first thermoelectric conversion modules and the second thermoelectric conversion modules.

Preferably, the thermoelectric power generating device may be configured such that the first steam flow portion is attached to the body case so as to surround the body case; and the first thermoelectric conversion modules are attached to both sides of the body case in a width direction so as to be opposed to each other with the exhaust-pipe introduction portion sandwiched therebetween.

In the thermoelectric power generating device, the first steam flow portion is attached to the body case so as to surround the body case, and the first thermoelectric conversion modules are attached to both sides of the body case in a width direction so as to be opposed to each other with the exhaust-pipe introduction portion sandwiched therebetween.

Accordingly, due to a pressure of the steam in the first steam flow portion, it is possible to evenly apply a pressure to the body case.

When a pressure is evenly applied to the body case, a contact pressure between the body case and the low-temperature parts of the first thermoelectric conversion modules increases, thereby making it possible to improve a heat transfer efficiency of the steam to the low-temperature parts of the first thermoelectric conversion modules.

Further, when a pressure of the steam is evenly applied to the low-temperature parts of the first thermoelectric conversion modules, it is possible to increase a contact pressure between the high-temperature parts of the first thermoelectric conversion module and the exhaust-pipe introduction portion, thereby making it possible to improve a heat transfer efficiency to the high-temperature parts of the first thermoelectric conversion modules. This consequently makes it possible to improve the generating efficiency of the first thermoelectric conversion modules.

Preferably, the thermoelectric power generating device may be configured to include: control means for controlling a pressure in the steam flow portion based on a temperature of the exhaust gas introduced into the exhaust-gas introduction portion.

Since the thermoelectric power generating device controls the pressure in the steam flow portion based on the temperature of the exhaust gas introduced into the exhaust-gas introduction portion, it is possible to improve the generating efficiency of the first thermoelectric conversion modules.

More specifically, the first thermoelectric conversion modules have a temperature range in which the generating efficiency is high. In view of this, if an exhaust-gas temperature can be estimated, it is possible to estimate around which temperature of the steam maximizes the generating efficiency of the first thermoelectric conversion modules.

For example, saturated steam caused when the refrigerant is boiled at a predetermined temperature under a predetermined atmospheric pressure has a correlation between pressure and temperature. In view of this, the pressure in the steam flow portion is controlled based on the temperature of the exhaust gas introduced into the exhaust-gas introduction portion, and the temperature of the saturated steam is controlled relative to the temperature of the exhaust gas, thereby making it possible to improve the generating efficiency of the first thermoelectric conversion modules.

Preferably, the thermoelectric power generating device may be configured to include control means for controlling a pressure in the steam flow portion based on a temperature of cooling water introduced into the cooling water flow portion.

The thermoelectric power generating device controls the pressure in the steam flow portion based on the temperature of the cooling water introduced into the cooling water flow portion, and controls the temperature of the saturated steam relative to the temperature of the cooling water, thereby making it possible to improve the generating efficiency of the second thermoelectric conversion modules.

Preferably, the thermoelectric power generating device may be configured such that the second steam flow portion includes: a mounting portion on which the second thermoelectric conversion modules are placed; and a movable portion provided in the mounting portion and displaced according to a pressure of the steam introduced into the second steam flow portion.

In the thermoelectric power generating device, since the movable portion displaced according to the pressure of the steam in the second steam flow portion is provided in the mounting portion or the second steam flow portion, when the movable portion is displaced, the mounting portion moves up, thereby allowing the mounting portion to evenly apply a pressure to the high-temperature parts of the second thermoelectric conversion modules.

This accordingly makes it possible to improve a heat transfer efficiency of the saturated steam to the high-temperature parts of the second thermoelectric conversion modules.

Further, when the pressure of the saturated steam is evenly applied to the high-temperature parts of the second thermoelectric conversion modules, it is possible to increase a contact pressure between the low-temperature parts of the second thermoelectric conversion modules and the cooling water flow portion, thereby making it possible to improve a heat transfer efficiency to the low-temperature parts of the second thermoelectric conversion modules. This consequently makes it possible to improve the generating efficiency of the second thermoelectric conversion modules.

Advantageous Effects of Invention

According to the present invention, it is possible to provide a thermoelectric power generating device that is able to decrease thermal distortion of thermoelectric conversion modules and to upsize the thermoelectric conversion modules, thereby making it possible to simplify a manufacturing operation and to decrease a manufacturing cost.

MODES FOR CARRYING OUT THE INVENTION

An embodiment of a thermoelectric power generating device according to the present invention will be described below with reference to the drawings. Note that the present embodiment deals with a case where the thermoelectric power generating device is applied to a water-cooled multi-cylinder internal combustion engine to be provided in a vehicle such as an automobile, for example, a four-cycle gasoline engine (hereinafter just referred to as an engine). Further, the engine is not limited to the gasoline engine.

FIGS. 1 to 8 are views illustrating one embodiment of the thermoelectric power generating device according to the present invention.

First of all, a configuration thereof is described.

Figure 1:
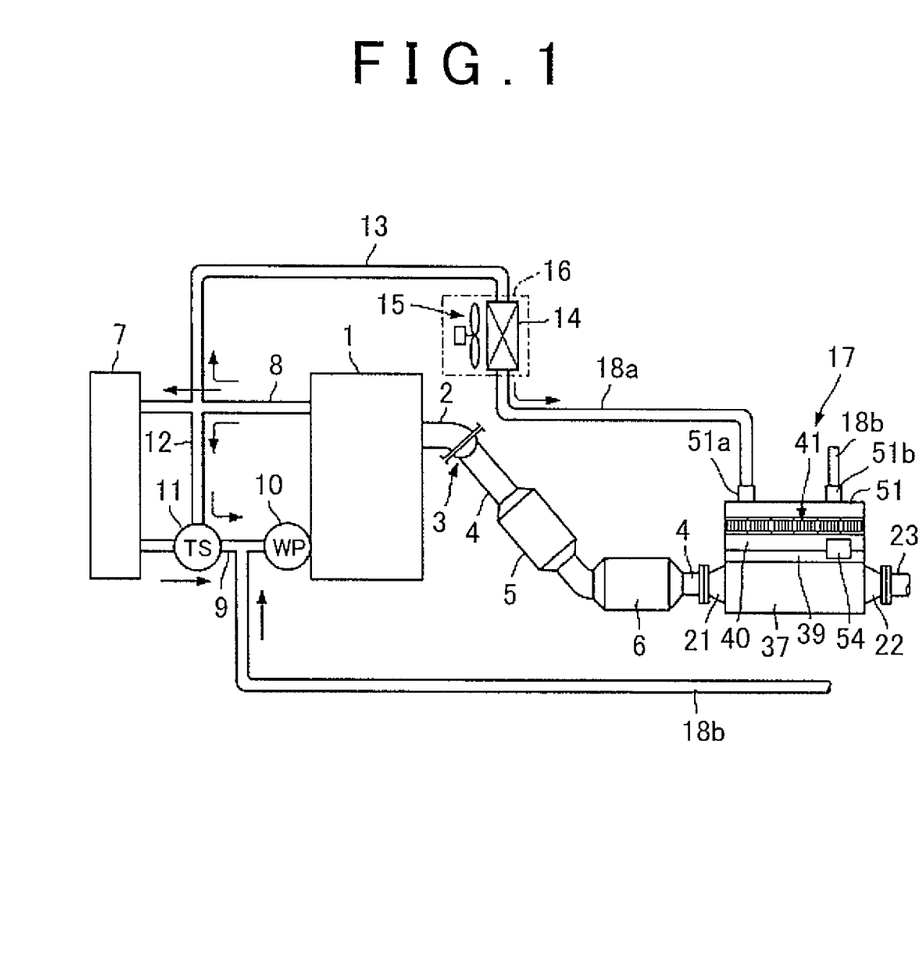
FIG. 1 is a view illustrating one embodiment of a thermoelectric power generating device according to the present invention, and is a schematic configuration diagram of an exhaust system of an engine including the thermoelectric power generating device.

As illustrated in FIG. 1, an engine 1 as an internal combustion engine provided in a vehicle such as an automobile is configured such that an air-fuel mixture obtained by mixing, at an appropriate air-fuel ratio, air supplied from an air-intake system and fuel supplied from a fuel supply system is supplied to a combustion chamber and then burnt, and then exhaust gas generated along with the burning is emitted from an exhaust system to the air.

The exhaust system is configured to include an exhaust manifold 2 attached to the engine 1, and an exhaust pipe 4 connected to the exhaust manifold 2 via a spherical joint 3, and an exhaust passage is formed by the exhaust manifold 2 and the exhaust pipe 4.

The spherical joint 3 allows the exhaust manifold 2 and the exhaust pipe 4 to swing moderately, and functions not to transmit a vibration or a movement of the engine 1 to the exhaust pipe 4 or functions to transmit the vibration or the movement thereto by damping.

Two catalysts 5, 6 are provided in series on the exhaust pipe 4, so that the exhaust gas is purified by the catalysts 5, 6.

In the catalysts 5, 6, the catalyst 5 provided on an upstream side of the exhaust pipe 4 in an exhaust direction of the exhaust gas is a so-called start catalyst (S/C), and the catalyst 6 provided on a downstream side of the exhaust pipe 4 in the exhaust direction of the exhaust gas is a so-called main catalyst (M/C) or underflow catalyst (U/F).

The catalysts 5, 6 are constituted, for example, by a three-way catalyst. The three-way catalyst demonstrates a purification interaction to collectively change carbon monoxide (CO), hydro carbon (HC), and nitrogen oxide (NOx) into a harmless component by a chemical reaction.

A water jacket is formed inside the engine 1, and the water jacket is filled with a coolant (hereinafter just referred to as cooling water) called long life coolant (LLC).

The cooling water is led out from a delivery pipe 8 attached to the engine 1 so as to be supplied to a radiator 7, and then returned from the radiator 7 to the engine 1 via a recirculation pipe 9 for the cooling water.

The radiator 7 cools off the cooling water circulated by a water pump 10, by heat exchange with external air.

Further, a bypass pipe 12 is connected to the recirculation pipe 9, and a thermostat 11 is placed between the bypass pipe 12 and the recirculation pipe 9. Hereby, a cooling water amount circulating through the radiator 7 and a cooling water amount circulating through the bypass pipe 12 are adjusted by the thermostat 11.

For example, at the time of a warm-up operation of the engine 1, the cooling water amount of the bypass pipe 12 is increased so as to promote warm-up.

A heater pipe 13 is connected to the bypass pipe 12, and a heater core 14 is provided in the middle of the heater pipe 13. The heater core 14 is a heat source for warming a vehicle interior by use of heat of the cooling water.

The air warmed by the heater core 14 is introduced into the vehicle interior by a blower fan 15. Note that a heater unit 16 is constituted by the heater core 14 and the blower fan 15.

Further, an upstream pipe 18a for supplying the cooling water to the after-mentioned thermoelectric power generating device 17 is provided in the heater pipe 13, and a downstream pipe 18b for discharging the cooling water from the thermoelectric power generating device 17 to the recirculation pipe 9 is provided between the thermoelectric power generating device 17 and the recirculation pipe 9.

In view of this, in a case where an exhaust-heat recovery operation (details about the exhaust-heat recovery operation will be described later) is performed in the thermoelectric power generating device 17, a temperature of the cooling water flowing through the downstream pipe 18b is higher than a temperature of the cooling water flowing through the upstream pipe 18a.

Figure 2:
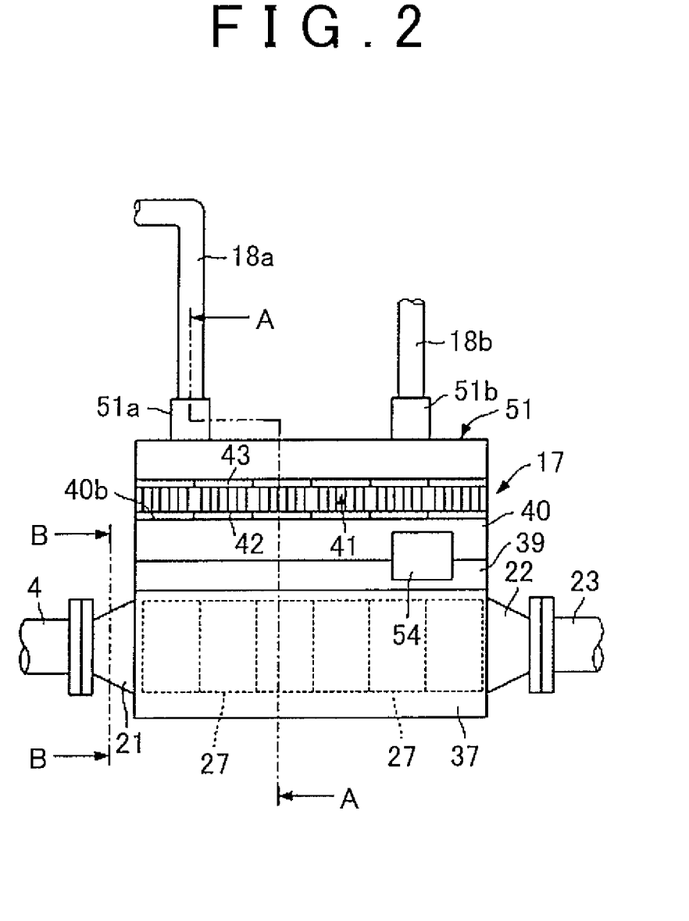
FIG. 2 is a view illustrating one embodiment of the thermoelectric power generating device according to the present invention, and is a side view of the thermoelectric power generating device.

In the meantime, the exhaust system of the engine 1 is provided with the thermoelectric power generating device 17 illustrated in FIGS. 1, 2. The thermoelectric power generating device 17 recovers heat of the exhaust gas discharged from the engine 1, and converts a thermal energy of the exhaust gas into an electrical energy.

Figure 3:
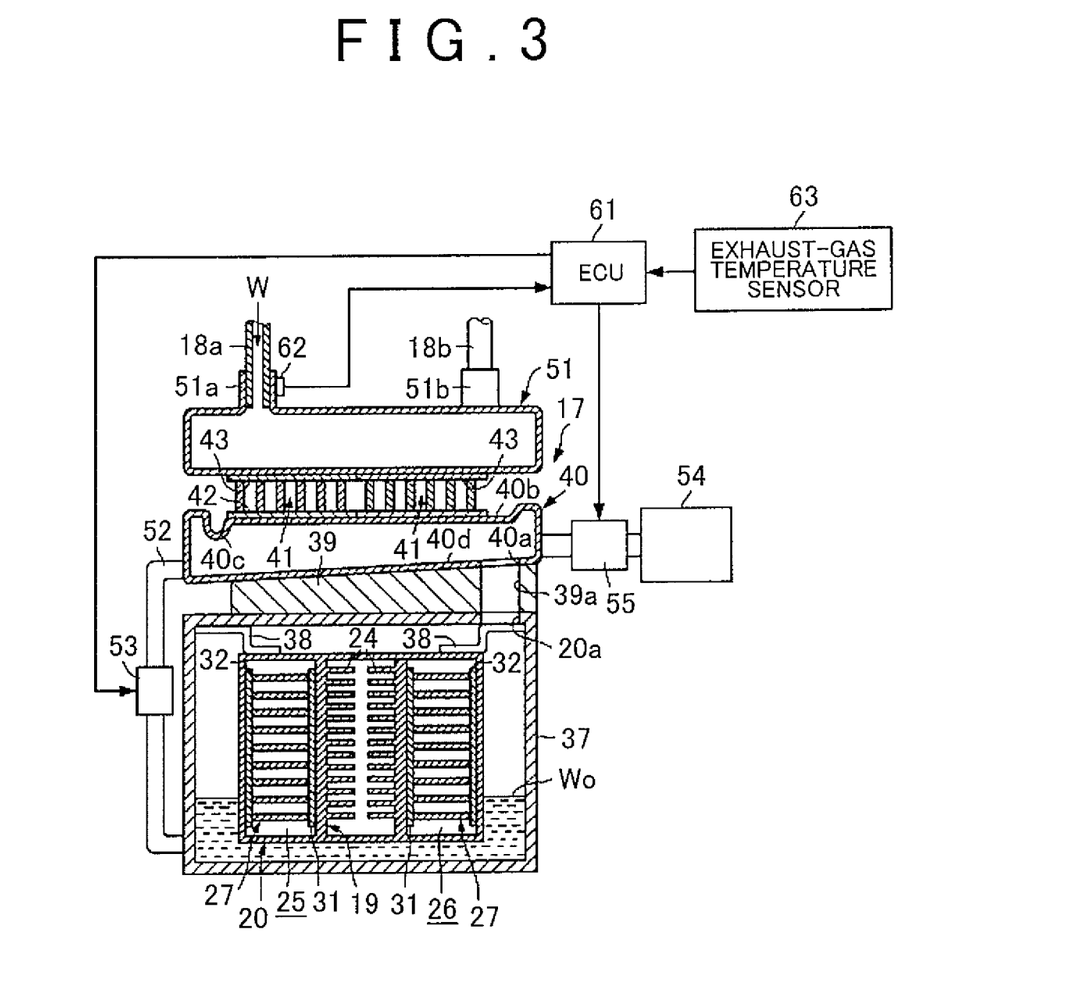
FIG. 3 is a view illustrating one embodiment of the thermoelectric power generating device according to the present invention, and is a sectional view taken along an arrow A-A in FIG. 2.

As illustrated in FIG. 3, the thermoelectric power generating device 17 includes a body case 20 having an exhaust-pipe portion 19 as an exhaust-gas introduction portion into which the exhaust gas discharged from the engine 1 is introduced.

As illustrated in FIG. 2, an introduction-pipe portion 21 connected to the exhaust pipe 4 is provided on an upstream side of the exhaust-pipe portion 19 in the exhaust direction, and a discharge-pipe portion 22 connected to a tail pipe 23 is provided on a downstream side of the exhaust-pipe portion 19 in the exhaust direction.

Accordingly, the exhaust gas discharged from the exhaust pipe 4 to the exhaust-pipe portion 19 via the introduction-pipe portion 21 is discharged from the exhaust-pipe portion 19 to the tail pipe 23 via the discharge-pipe portion 22, and then discharged to the external air from the tail pipe 23.

Further, as illustrated in FIG. 3, a plurality of heat-absorption fins 24 is formed inside the exhaust-pipe portion 19, and the heat-absorption fins 24 transmit heat of the exhaust gas to the exhaust-pipe portion 19.

Further, module chambers 25, 26 are formed in the body case 20 so as to sandwich the exhaust-pipe portion 19 therebetween, and thermoelectric conversion modules 27 as first thermoelectric conversion modules are accommodated in the module chambers 25, 26.

That is, the thermoelectric conversion modules 27 are attached to both sides of the body case 20 in its width direction so as to be opposed to each other with the exhaust-pipe portion 19 sandwiched therebetween.

Note that the exhaust direction defined in the thermoelectric power generating device 17 of the present invention indicates an exhaust direction of exhaust gas flowing through the exhaust-pipe portion 19, and the upstream and the downstream are directions in terms of the exhaust direction. That is, an upstream side relative to the thermoelectric power generating device 17 is an engine-1 side and a downstream side is a tail-pipe-23 side.

Figure 5:
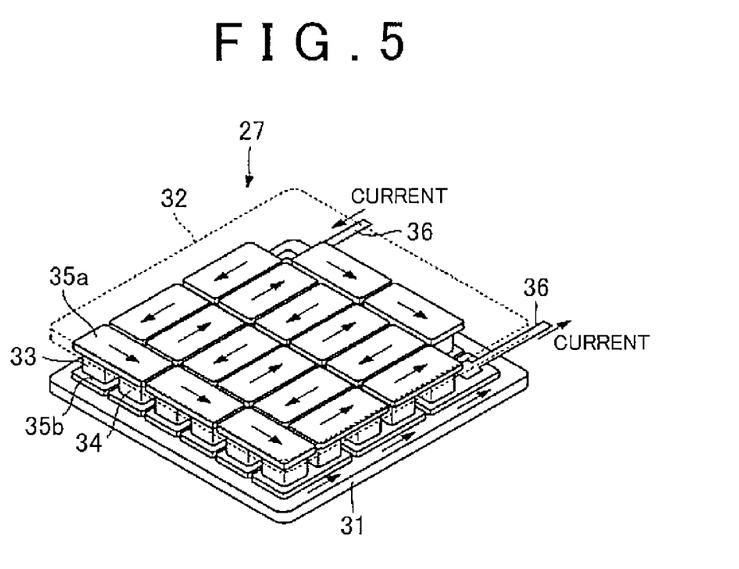
FIG. 5 is a view illustrating one embodiment of the thermoelectric power generating device according to the present invention, and is a perspective view of a thermoelectric conversion module having a high operation temperature range.

As illustrated in FIG. 5, the thermoelectric conversion module 27 is configured such that: a plurality of N-type thermoelectric transducers 33 and P-type thermoelectric transducers 34 generating an electromotive force according to a temperature difference due to the Seebeck effect is provided between a heat-receiving substrate 31 made from insulating ceramics and constituting a high-temperature part and a heat-dissipation substrate 32 made from insulating ceramics and constituting a low-temperature part; and the N-type thermoelectric transducers 33 and the P-type thermoelectric transducers 34 are provided alternately so as to be serially connected to each other via electrodes 35a, 35b.

The plurality of thermoelectric conversion modules 27 are provided in series along the exhaust direction in the module chambers 25, 26 as illustrated in FIG. 2, and the thermoelectric conversion modules 27 adjacent to each other in the exhaust direction are electrically connected to each other via electric wirings 36.

As illustrated in FIG. 2, the thermoelectric conversion module 27 is configured such that the heat-receiving substrate 31 is opposed to the exhaust-pipe portion 19 so as to make contact with the exhaust-pipe portion 19 and the heat-dissipation substrate 32 is opposed to the after-mentioned steam tank 37 so as to make contact with the body case 20. The thermoelectric conversion module 27 performs a thermoelectric power generation according to a temperature difference between the heat-receiving substrate 31 and the heat-dissipation substrate 32, so as to supply an electric power to a battery via a cable (not shown).

Further, the N-type thermoelectric transducers 33 and the P-type thermoelectric transducers 34 are formed from a thermoelectric material such as an Mg—Si system, and have such a characteristic that a thermoelectric conversion efficiency becomes high at an operation temperature range of around 400° C. to 500° C. Note that, in FIGS. 2, 3, the thermoelectric conversion module 27 is simplified.

Figure 4:
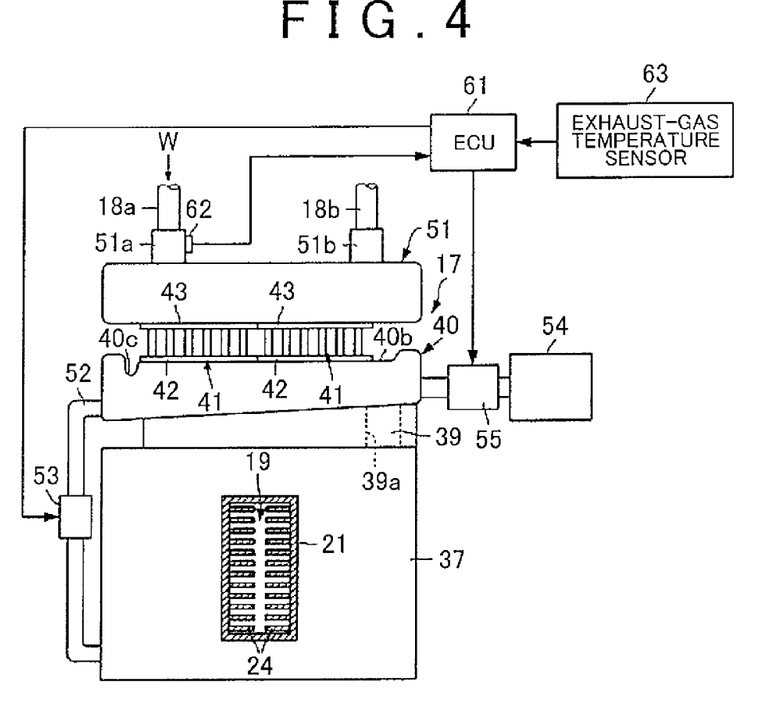
FIG. 4 is a view illustrating one embodiment of the thermoelectric power generating device according to the present invention, and is a sectional view taken along an arrow B-B in FIG. 2.

In the meantime, as illustrated in FIGS. 2 to 4, the steam tank 37 as a steam flow portion and a first steam flow portion is provided outside the body case 20 so as to surround the body case 20, and the steam tank 37 is opposed to the heat-dissipation substrates 32 of the thermoelectric conversion modules 27 via the body case 20.

As illustrated in FIG. 3, as refrigerant, water Wo is accumulated in a bottom face of the steam tank 37, for example, and the steam tank 37 is attached to the body case 20 via support brackets 38. Note that the support brackets 38 may be provided at an upstream end and at a downstream end of the body case 20 so as to be separated from each other, for example, or may be provided in a central portion of the body case 20 in the exhaust direction.

A steam tank 40 as a steam flow portion and a second steam flow portion is provided above the body case 20 via a support base 39. In FIG. 3, respective communicating holes 20a, 39a, 40a are formed in an upper-right side of the body case 20, a right side of the support base 39, and a lower-right side of the steam tank 40, and an inside of the steam tank 37 communicates with an inside of the steam tank 40 via the communicating holes 20a, 39a, 40a. Note that the communicating holes 20a, 39a, 40a may be formed at given intervals in the exhaust direction, or may extend over the exhaust direction.

In the present embodiment, when the exhaust gas is introduced into the exhaust-pipe portion 19, heat of the exhaust gas is transmitted to the steam tank 37 via the body case 20, so that the water Wo in the steam tank 37 evaporates and saturated steam moves up in the steam tank 37.

At this time, an electric power is generated by the thermoelectric conversion modules 27 due to a temperature difference between the exhaust gas flowing through the exhaust-pipe portion 19 and the saturated steam moving up in the steam tank 37.

Further, the saturated steam moving up in the steam tank 37 is introduced into the steam tank 40 via the communicating holes 20a, 39a, 40a.

Note that upstream ends and downstream ends of the steam tanks 37, 40 are closed (FIG. 4 illustrates the upstream ends of the steam tanks 37, 40), and the insides of the steam tanks 37, 40 are closed spaces.

An upper part of the steam tank 40 constitutes a mounting portion 40b. On the mounting portion 40b, a cooling water tank 51 as a cooling water flow portion is provided via thermoelectric conversion modules 41 as second thermoelectric conversion modules.

The cooling water tank 51 includes a cooling-water inlet portion 51a connected to the upstream pipe 18a and a cooling-water outlet portion 51b connected to the downstream pipe 18b.

The cooling water tank 51 is configured such that the cooling-water inlet portion 51a is provided on an upstream side in the exhaust direction relative to the cooling-water outlet portion 51b so that cooling water W introduced into the cooling water tank 51 from the cooling-water inlet portion 51a flows in the same direction as the exhaust direction of the exhaust gas (see FIGS. 1, 2).

Figure 6:
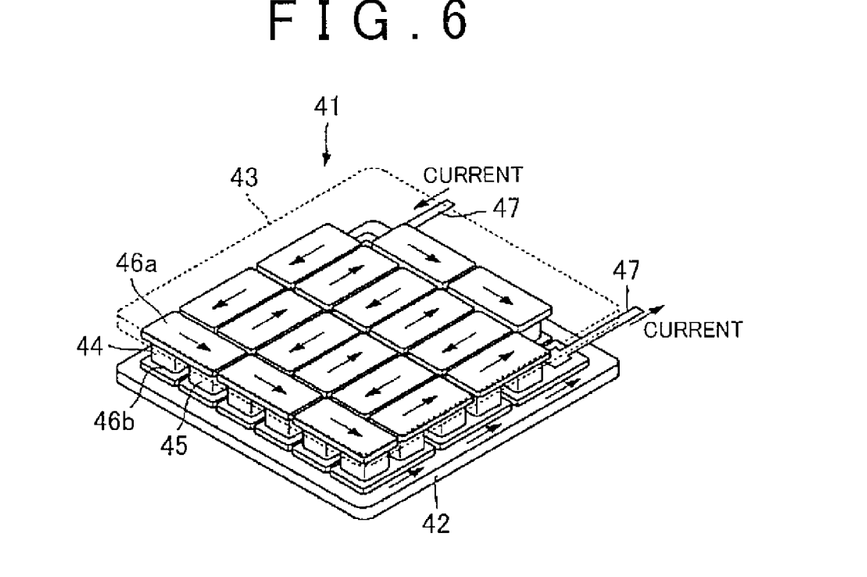
FIG. 6 is a view illustrating one embodiment of the thermoelectric power generating device according to the present invention, and is a perspective view of a thermoelectric conversion module having a low operation temperature range.

As illustrated in FIG. 6, the thermoelectric conversion module 41 is configured such that: a plurality of N-type thermoelectric transducers 44 and P-type thermoelectric transducers 45 generating an electromotive force according to a temperature difference due to the Seebeck effect is provided between a heat-receiving substrate 42 made from insulating ceramics and constituting a high-temperature part and a heat-dissipation substrate 43 made from insulating ceramics and constituting a low-temperature part; and the N-type thermoelectric transducers 44 and the P-type thermoelectric transducers 45 are provided alternately so as to be serially connected to each other via electrodes 46a, 46b.

The plurality of thermoelectric conversion modules 41 are provided in parallel in a direction perpendicular to the exhaust direction and in series in the exhaust direction, and the thermoelectric conversion modules 41 adjacent to each other are electrically connected to each other via electric wirings 47.

The thermoelectric conversion module 41 is configured such that the heat-receiving substrate 42 is opposed to the steam tank 40 so as to make contact with the steam tank 40 and the heat-dissipation substrate 43 is opposed to the cooling water tank 51 so as to make contact with the cooling water tank 51. The thermoelectric conversion module 41 performs a thermoelectric power generation according to a temperature difference between the heat-receiving substrate 42 and the heat-dissipation substrate 43, so as to supply an electric power to the battery via a cable (not shown).

Further, the N-type thermoelectric transducers 44 and the P-type thermoelectric transducers 45 are formed from a thermoelectric material such as a Bi—Te system or the like, and have such a characteristic that a thermoelectric conversion efficiency becomes high at an operation temperature range of around 100° C. to 200° C. Note that, in FIGS. 2 to 4, the thermoelectric conversion module 41 is simplified.

That is, the operation temperature range of the thermoelectric conversion module 27 of the present embodiment is set high, and the operation temperature range of the thermoelectric conversion module 41 is set low relative to the thermoelectric conversion module 27.

Figure 7:
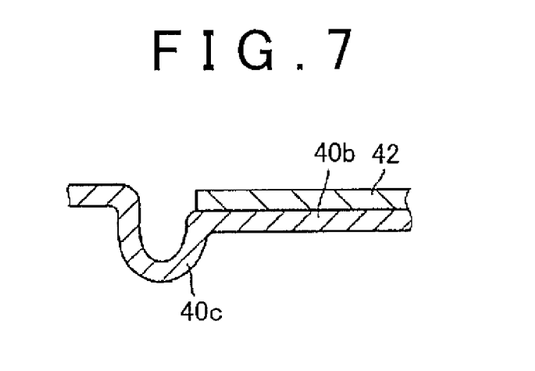
FIG. 7 is a view illustrating one embodiment of the thermoelectric power generating device according to the present invention, and is a view illustrating a movable portion of a steam tank.

Further, as illustrated in FIGS. 3, 4, 7, the mounting portion 40b of the steam tank 40 is provided with a movable portion 40c having a bellows shape. The movable portion 40c is freely displaceable by a pressure of the saturated steam introduced into the steam tank 40. Because of this, the mounting portion 40b is displaced in an up-down direction along with the displacement of the movable portion 40c.

In the present embodiment, when the saturated steam is introduced into the steam tank 40 from the steam tank 37, an electric power is generated by the thermoelectric conversion modules 41 due to a temperature difference between the saturated steam and the cooling water W flowing through the cooling water tank 51.

At this time, the saturated steam introduced into the steam tank 40 is cooled off by the cooling water W flowing through the cooling water tank 51, so that the saturated steam becomes condensed water. The condensed water is accumulated in the steam tank 40.

As illustrated in FIG. 3, a bottom part of the steam tank 40 constitutes a tapered portion 40d formed in a tapered shape that is lowered from a right side toward a left side, so that the condensed water, which is condensed in the steam tank 40, moves from the right to the left along the tapered portion 40d in FIG. 3.

In FIGS. 3, 4, a recirculation pipe 52 is provided in left ends of the steam tank 37 and the cooling water tank 51, and the steam tank 37 and the cooling water tank 51 communicate with each other via the recirculation pipe 52.

The recirculation pipe 52 recirculates the condensed water accumulated in the steam tank 40, from the steam tank 40 to the steam tank 37, and the condensed water thus recirculated into the steam tank 37 is accumulated in the bottom face of the steam tank 37.

Further, the recirculation pipe 52 is provided with an opening/closing valve 53. The opening/closing valve 53 is constituted by a normally-open magnetic valve. When a closing signal is input from an ECU (Electronic Control Unit) 61, the opening/closing valve 53 is closed, and when no closing signal is input from the ECU 61, the opening/closing valve 53 is opened.

Further, a pressurizing/depressurizing pump 54 constituted by a tube pump, a diaphragm-type pump, or the like is connected to the steam tank 40, and a normally-closed opening/closing valve 55 is provided between the pressurizing/depressurizing pump 54 and the steam tank 40.

When an opening signal is input from the ECU 61, the opening/closing valve 55 is opened, and when no opening signal is input from the ECU 61, the opening/closing valve 55 is closed.

Further, the cooling-water inlet portion 51a is provided with a water temperature sensor 62. The water temperature sensor 62 detects a temperature of the cooling water W introduced into the cooling water tank 51, and outputs detected information to the ECU 61. Note that the water temperature sensor 62 may be provided in the upstream pipe 18a.

Further, the exhaust pipe 4 or the exhaust-pipe portion 19 is provided with an exhaust-gas temperature sensor 63 for detecting a temperature of the exhaust gas. The exhaust-gas temperature sensor 63 detects the temperature of the exhaust gas introduced into the exhaust-pipe portion 19, and outputs detected information to the ECU 61.

The ECU 61 is constituted by an electronic control circuit including a CPU (Central Processing Unit), a ROM (Read Only Memory), a RAM (Random Access Memory), an input-output interface, and so on. The ECU 61 performs an opening/closing control on the opening/closing valves 53, 55 based on the detected information from the water temperature sensor 62 or the exhaust-gas temperature sensor 63. In the present embodiment, the pressurizing/depressurizing pump 54, the opening/closing valve 55, and the ECU 61 constitute control means.

Next will be described an interaction.

The steam tanks 37, 40 constituted by enclosed space are depressurized to a given atmospheric pressure or less by the pressurizing/depressurizing pump 54, so that the water Wo accumulated in the steam tank 37 becomes saturated steam at a predetermined temperature (a boiling point). That is, by adjusting pressures in the steam tanks 37, 40 by the pressurizing/depressurizing pump 54, it is possible to adjust a temperature of the saturated steam caused in the steam tank 37.

At the time of cold start of the engine 1, the cooling water in the catalysts 5, 6 and the engine 1 is all at a low temperature (about an outdoor temperature).

When the engine 1 is started from this state, exhaust gas at a low temperature is discharged from the engine 1 to the exhaust pipe 4 via the exhaust manifold 2 along with the start of the engine 1, and temperatures of the two catalysts 5, 6 are increased by the exhaust gas.

Further, a warm-up operation is performed when the cooling water is returned to the engine 1 via the bypass pipe 12 without passing through the radiator 7.

At the time of the cold starting of the engine 1, the water Wo in the steam tank 37 becomes saturated steam due to the exhaust gas introduced into the exhaust-pipe portion 19 from the exhaust pipe 4, and the saturated steam is introduced from the steam tank 37 into the steam tank 40 via the communicating holes 20*a*, 39*a*, 40*a*.

This increases a temperature of the cooling water W circulating through the cooling water tank 51, thereby promoting warm-up of the engine 1.

Further, after the warm-up of the engine 1, the communication between the bypass pipe 12 and the recirculation pipe 9 is blocked by the thermostat 11, so that the cooling water led from the engine 1 via the delivery pipe 8 is led to the recirculation pipe 9 via the radiator 7. Accordingly, the cooling water at a low temperature is supplied to the engine 1, thereby increasing cooling performance of the engine 1.

Next will be described an interaction of the thermoelectric power generating device 17.

When the exhaust gas of the engine 1 is introduced from the exhaust pipe 4 into the exhaust-pipe portion 19, heat of the exhaust gas is transmitted to the steam tank 37 via the thermoelectric conversion modules 27, and the water Wo in the steam tank 37 evaporates and is introduced into the steam tank 40 via the communicating holes 20*a*, 39*a*, 40*a*.

At this time, the heat of the high-temperature exhaust gas is transmitted to the heat-receiving substrates 31 of the thermoelectric conversion modules 27, heat of the saturated steam having a temperature higher than the cooling water but lower than the exhaust gas, that is, a medium temperature, is transmitted to the heat-dissipation substrates 32, thereby causing the thermoelectric conversion modules 27 to perform a power generation due to a temperature difference between the exhaust gas and the saturated steam.

Then, an electric power generated by the thermoelectric conversion modules 27 is supplied to the battery via the cable (not shown) so as to be charged in the battery. Note that the battery is constituted by an auxiliary battery for supplying an electric power to accessories of a vehicle.

Further, the medium-temperature saturated steam introduced into the steam tank 40 is transmitted to the heat-receiving substrates 42 of the thermoelectric conversion modules 41, and heat of the low-temperature cooling water is transmitted to the heat-dissipation substrates 43, thereby causing the thermoelectric conversion modules 41 to perform a power generation due to a temperature difference between the cooling water and the saturated steam. Then, an electric power generated by the thermoelectric conversion modules 41 is supplied to the battery via the cable (not shown) so as to be charged in the battery.

Here, the saturated steam to be filled in the steam tanks 37, 40 is the saturated steam that evaporates at a predetermined temperature in the steam tanks 37, 40 in a depressurized state, and includes water content. Then, the saturated steam cooled off in the steam tank 40 by the cooling water W becomes condensed water, moves to the left along the tapered portion 40*d* of the steam tank 40 in FIG. 3, and is recirculated into the steam tank 37 via the recirculation pipe 52.

Accordingly, the water Wo is always accumulated in the steam tank 37, and such an operation is repeated that the saturated steam caused in the steam tank 37 is introduced from the steam tank 37 into the steam tank 40, and the condensed water caused in the steam tank 40 so as to be condensed is recirculated into the steam tank 37. That is, in the thermoelectric power generating device 17 of the present embodiment, a steam loop is formed by the steam tanks 37, 40.

Meanwhile, in a high rotation range of the engine 1, the temperature of the exhaust gas becomes 500° C. or more, for example, so that a power generation is performed by the thermoelectric conversion modules 27 having a high operation temperature range due to a temperature difference between the high-temperature exhaust gas and the medium-temperature saturated steam. Further, a power generation is performed by the thermoelectric conversion modules 41 having a low operation temperature due to a temperature difference between the medium-temperature saturated steam and the low-temperature cooling water.

That is, in the thermoelectric power generating device 17 of the present embodiment, the power generation is performed at two stages by the thermoelectric conversion modules 27 having a high operation temperature range and by the thermoelectric conversion modules 41 having a low operating temperature.

Further, in a low rotation range of the engine 1, the temperature of the exhaust gas becomes 300° C. or less, for example, so that the thermoelectric conversion modules 27 does not become an effective temperature range for the power generation. In the meantime, the thermoelectric conversion modules 41 configured to perform a power generation due to a temperature difference between the medium-temperature saturated steam and the low-temperature cooling water becomes an effective temperature range for the power generation, so that the power generation is performed by the thermoelectric conversion modules 41.

Further, the thermoelectric power generating device 17 of the present embodiment is configured such that: the steam tank 37 is attached to the body case 20 so as to surround the body case 20, and the thermoelectric conversion modules 27 are attached to the body case 20 so as to be opposed to each other in the width direction of the body case 20 with the exhaust-pipe portion 19 sandwiched therebetween.

Accordingly, a pressure is evenly applied to the body case 20 by the pressure of the steam inside the steam tank 37. When a pressure is evenly applied to the body case 20, a contact pressure between the body case 20 and the heat-dissipation substrates 32 of the thermoelectric conversion modules 27 increases, thereby making it possible to improve a heat transfer efficiency of the saturated steam to the heat-dissipation substrates 32 of the thermoelectric conversion modules 27.

Further, when a pressure of the saturated steam is evenly applied to the low-temperature parts of the heat-dissipation substrates 32 of the thermoelectric conversion modules 27, it is possible to increase a contact pressure between the heat-receiving substrates 31 of the thermoelectric conversion modules 27 and the exhaust-pipe portion 19, thereby making it possible to improve a heat transfer efficiency to the heat-receiving substrates 31 of the thermoelectric conversion modules 27. This consequently makes it possible to improve a generating efficiency of the thermoelectric conversion modules 27.

Further, the thermoelectric power generating device 17 of the present embodiment is configured such that: the steam tank 40 includes the mounting portion 40b on which the thermoelectric conversion modules 41 are placed, and the movable portion 40c provided in the mounting portion 40b and displaced according to a pressure of the steam introduced into the steam tank 40.

Figure 8:
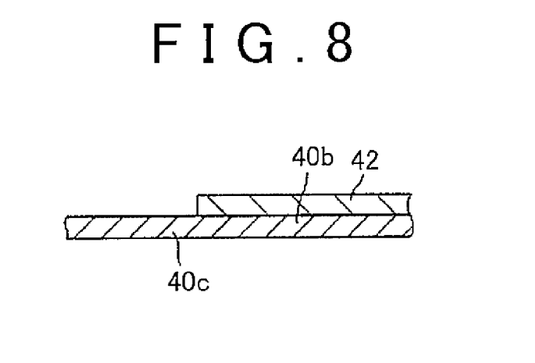
FIG. 8 is a view illustrating one embodiment of the thermoelectric power generating device according to the present invention, and is a view illustrating a state where the movable portion of the steam tank is deformed and a mounting portion is displaced upward.

Accordingly, as illustrated in FIG. 8, when the movable portion 40c is displaced upward according to the pressure of the saturated steam in the steam tank 40, the mounting portion 40b moves up, so that the mounting portion 40b is able to evenly apply a pressure to the heat-receiving substrates 42 of the thermoelectric conversion modules 41.

This makes it possible to improve a heat transfer efficiency of the saturated steam to the heat-receiving substrates 42 of the thermoelectric conversion modules 41.

Further, when the pressure of the saturated steam in the steam tank 40 is evenly applied to the heat-receiving substrates 42 of the thermoelectric conversion modules 41, it is possible to increase a contact pressure between the heat-dissipation substrates 43 of the thermoelectric conversion modules 41 and the cooling water tank 51, thereby making it possible to improve a heat transfer efficiency to the heat-dissipation substrates 43 of the thermoelectric conversion modules 41. This consequently makes it possible to improve a generating efficiency of the thermoelectric conversion modules 41.

On the other hand, when a heavy load operation of the engine 1 continues, a temperature of the cooling water W increases so that the cooling water might boil under the influence of the medium-temperature saturated steam introduced into the cooling water tank 51.

In the thermoelectric power generating device 17 of the present embodiment, the ECU 61 monitors the temperature of the cooling water based on detected information from the water temperature sensor 62, and determines whether or not the temperature of the cooling water reaches a predetermined temperature or more at which the cooling water is easy to boil. With the provision that the cooling water reaches the predetermined temperature or more, the ECU 61 transmits a closing signal to the opening/closing valve 53 so as to close the opening/closing valve 53.

This blocks the communication between the steam tank 37 and the steam tank 40, so that the condensed water in the steam tank 37 is not recirculated into the steam tank 40, thereby resulting in that the condensed water is accumulated in the steam tank 40. That is, the low-temperature condensed water cooled off by the cooling water W of the cooling water tank 51 is accumulated in the steam tank 40.

As a result, the cooling water W in the cooling water tank 51 is not boiled due to the saturated steam, thereby making it possible to prevent the cooling performance of the engine 1 from decreasing.

Further, the ECU 61 may be configured such that: the ECU 61 acquires the temperature of the exhaust gas introduced into the exhaust-pipe portion 19, based on detected information from the exhaust-gas temperature sensor 63, transmits an opening signal to the opening/closing valve 55 so as to open the opening/closing valve 55, and pressurizes or depressurizes the pressurizing/depressurizing pump 54 based on the temperature of the exhaust gas so as to adjust the pressures in the steam tanks 37, 40.

More specifically, the thermoelectric conversion modules 27 having a high operation temperature range have a temperature range in which the generating efficiency is high. Accordingly, if an exhaust-gas temperature is found, it is possible to estimate around which temperature of the saturated steam in the steam tanks 37, 40 maximizes the generating efficiency of the thermoelectric conversion modules 27.

The saturated steam caused when the water Wo is boiled at a predetermined temperature under a predetermined atmospheric pressure has such a correlation between temperature and pressure that the temperature increases as the pressure increases, and the temperature decreases as the pressure decreases. In view of this, the pressures in the steam tanks 37, 40 are controlled based on the temperature of the exhaust gas introduced into the exhaust-pipe portion 19 in an operating range where the temperature of the exhaust gas is high, so that the temperature of the saturated steam is controlled relative to the temperature of the exhaust gas, thereby making it possible to improve the generating efficiency of the thermoelectric conversion modules 27.

Further, the ECU 61 may be configured such that the ECU 61 acquires the temperature of the cooling water introduced into the cooling water tank 51 based on detected information from the water temperature sensor 62, transmits an opening signal to the opening/closing valve 55 so as to open the opening/closing valve 55, and pressurizes or depressurizes the pressurizing/depressurizing pump 54 based on the temperature of the cooling water so as to adjust the pressures in the steam tanks 37, 40.

More specifically, the thermoelectric conversion modules 41 having a low operation temperature range have a temperature range where the generating efficiency is high. In view of this, if the temperature of the cooling water is found, it is possible to estimate around which temperature of the saturated steam in the steam tanks 37, 40 maximizes the generating efficiency of the thermoelectric conversion modules 41.

In view of this, in an operating range where the temperature of the exhaust gas is low, the pressures in the steam tanks 37, 40 are controlled based on the temperature of the cooling water introduced into the cooling water tank 51, so as to control the temperature of the saturated steam relative to the temperature of the cooling water, thereby making it possible to improve the generating efficiency of the thermoelectric conversion modules 41.

Note that the ECU 61 acquires temperature information of the exhaust gas based on detected information from the exhaust-gas temperature sensor 63, but means for acquiring the temperature of the exhaust gas is not limited to this.

For example, based on engine load information such as an air intake amount acquired from an existing air flow meter in the vehicle, or detected information from an accelerator opening sensor for detecting an opening degree of the an accelerator pedal, the ECU 61 may estimate the temperature of the exhaust gas by referring to a map in which the temperature of the exhaust gas is associated with an engine load and an accelerator opening.

Thus, the thermoelectric power generating device 17 of the present embodiment is configured to include: the body case 20 accommodating therein the thermoelectric conversion modules 27; the exhaust-pipe portion 19 provided in the body case 20 so as to be opposed to the heat-receiving substrates 31 of the thermoelectric conversion modules 27; the steam tank 37 attached to an outer side of the body case 20 so as to be opposed to the heat-dissipation substrates 32 of the thermoelectric conversion modules 27; the steam tank 40 provided above the body case 20; the thermoelectric conversion modules 41 provided above the steam tank 40 so that the heat-dissipation substrates 43 thereof are opposed to the steam tank 40; and the cooling water tank 51 provided above the thermoelectric conversion modules 41 so as to be opposed to the heat-receiving substrates 42 of the thermoelectric conversion modules 41.

In the thermoelectric power generating device 17, the exhaust gas is introduced into the heat-receiving substrates 31 of the thermoelectric conversion modules 27 having a high operation temperature range, and the saturated steam is introduced into the heat-dissipation substrates 32 of the thermoelectric conversion modules 27. This makes it possible to prevent an excessively large temperature difference between the heat-receiving substrates 31 and the heat-dissipation substrates 32 and to restrain thermal distortion of the thermoelectric conversion modules 27.

This makes it possible to upsize the thermoelectric conversion modules 27, so that the number of wirings and the like can be reduced at the time when the thermoelectric conversion modules 27 are attached to the body case 20 of the thermoelectric power generating device 17.

Further, the saturated steam is introduced into the heat-receiving substrates 42 of the thermoelectric conversion modules 41 having an operation temperature range lower than the thermoelectric conversion modules 27, and the cooling water is introduced into the heat-dissipation substrates 43 of the thermoelectric conversion modules 41. This makes it possible to prevent an excessively large temperature difference between the heat-receiving substrates 42 and the heat-dissipation substrates 43 of the thermoelectric conversion modules 41 and to restrain thermal distortion of the thermoelectric conversion modules 41.

This makes it possible to upsize the thermoelectric conversion modules 41, so that the number of wirings and the like can be reduced at the time when the thermoelectric conversion modules 41 are disposed between the steam tank 40 and the cooling water tank 51 of the thermoelectric power generating device 17.

This consequently makes it possible to simplify a manufacturing operation of the thermoelectric power generating device 17 and to reduce a manufacturing cost of the thermoelectric power generating device 17.

Further, in a range where the temperature of the exhaust gas is high, the thermoelectric conversion modules 27, 41 perform a power generation, and in a range where the temperature of the exhaust gas is low, the thermoelectric conversion modules 41 perform a power generation. Hereby, it is possible to perform the power generation in a large temperature range, that is, in a large operating range of the vehicle.

Further, since the steam at the same temperature is introduced into the heat-dissipation substrates 32 of the thermoelectric conversion modules 27 and the heat-receiving substrates 42 of the thermoelectric conversion modules 41, it is possible to equalize temperatures of the heat-dissipation substrates 32 of the thermoelectric conversion modules 27 and the heat-receiving substrates 42 of the thermoelectric conversion modules 41, thereby making it possible to improve the generating efficiencies of the thermoelectric conversion modules 27, 41.

Note that, in the present embodiment, water is used as the refrigerant, but the refrigerant is not limited to water. For example, any refrigerant such as alcohol may be used as long as the refrigerant causes steam at the temperature of the exhaust gas.

As described above, the thermoelectric power generating device according to the present invention has such an effect that it is possible to decrease thermal distortion of the thermoelectric conversion modules and upsize the thermoelectric conversion modules, thereby making it possible to simplify the manufacturing operation and decrease the manufacturing cost. In view of this, the thermoelectric power generating device according to the present invention is useful as a thermoelectric power generating device performing a thermoelectric power generation by use of exhaust gas discharged from an internal combustion engine.

DESCRIPTION OF THE REFERENCE NUMERALS

1 engine (internal combustion engine)
17 thermoelectric power generating device
19 exhaust-pipe portion (exhaust-gas introduction portion)
20 body case
27 thermoelectric conversion module (first thermoelectric conversion module)
31, 42 heat-receiving substrate (heat-receiving portion)
32, 43 heat-dissipation substrate (heat-dissipation portion)
37 steam tank (steam flow portion, first steam flow portion)
40 steam tank (steam flow portion, second steam flow portion)
40b mounting portion
40c movable portion
41 thermoelectric conversion module (second thermoelectric conversion module)
51 cooling water tank (cooling water flow portion)
54 pressurizing/depressurizing pump (control means)
55 opening/closing valve (control means)
61 ECU (control means)

The invention claimed is:

1. A thermoelectric power generating device comprising:
   thermoelectric conversion modules each performing a thermoelectric power generation according to a temperature difference between a high-temperature part and a low-temperature part, wherein the thermoelectric conversion modules comprise first thermoelectric conversion modules having a high operation temperature range and second thermoelectric conversion modules having an operation temperature range lower than that of the first thermoelectric conversion modules;
   an exhaust-gas introduction portion configured to introduce, into the high-temperature parts of the first thermoelectric conversion modules, exhaust gas discharged from an internal combustion engine; and
   a steam flow portion configured to introduce, into the low-temperature parts of the first thermoelectric conversion modules and into the high-temperature parts of the second thermoelectric conversion modules, steam of refrigerant heated by heat of the exhaust gas, wherein the steam flow portion comprises a first steam flow portion and a second steam flow portion communicating with the first steam flow portion;

a body case accommodating therein the first thermoelectric conversion modules;

the exhaust-gas introduction portion provided in the body case so as to be opposed to the high-temperature parts of the first thermoelectric conversion modules;

the first steam flow portion attached to an outer side of the body case so as to be opposed to the low-temperature parts of the first thermoelectric conversion modules;

the second steam flow portion provided above the body case;

the second thermoelectric conversion modules provided above the second steam flow portion so that the high-temperature parts thereof are opposed to the second steam flow portion; and a cooling water flow portion provided above the second thermoelectric conversion modules so as to be opposed to the low-temperature parts of the second thermoelectric conversion modules.

2. The thermoelectric power generating device according to claim 1, characterized in that:

the first steam flow portion is attached to the body case so as to surround the body case; and the first thermoelectric conversion modules are attached to both sides of the body case in a width direction so as to be opposed to each other with the exhaust-gas introduction portion sandwiched therebetween.

3. The thermoelectric power generating device according to claim 1, characterized by comprising:

an electronic control unit configured to control a pressure in the steam flow portion based on a temperature of the exhaust gas introduced into the exhaust-gas introduction portion.

4. The thermoelectric power generating device according to claim 1, characterized by comprising:

an electronic control unit configured to control a pressure in the steam flow portion based on a temperature of cooling water introduced into the cooling water flow portion.

5. The thermoelectric power generating device according to claim 1, characterized in that:

the second steam flow portion includes: a mounting portion on which the second thermoelectric conversion modules are placed; and a movable portion provided in the mounting portion and displaced according to a pressure of the steam introduced into the second steam flow portion.

* * * * *